United States Patent [19]

Carlson

[11] Patent Number: 5,131,001
[45] Date of Patent: Jul. 14, 1992

[54] MONOLITHIC SEMICONDUCTOR LIGHT EMITTER AND AMPLIFIER

[75] Inventor: Nils W. Carlson, Cranbury, N.J.

[73] Assignee: David Sarnoff Research Center, Inc., Princeton, N.J.

[21] Appl. No.: 632,263

[22] Filed: Dec. 21, 1990

[51] Int. Cl.$^5$ .................... H01S 3/19; H01S 3/08
[52] U.S. Cl. ........................... 372/50; 372/96; 372/97; 372/102
[58] Field of Search .......... 372/50, 96, 97, 45, 372/102

[56] References Cited

U.S. PATENT DOCUMENTS

| | | | |
|---|---|---|---|
| 3,484,713 | 12/1969 | Fenner. | |
| 4,194,162 | 3/1980 | Uematsu | 330/4.3 |
| 4,376,307 | 3/1983 | Rozzi | 372/45 |
| 4,380,074 | 4/1983 | Walsh | 372/43 |
| 4,794,346 | 12/1988 | Miller | 330/4.3 |
| 4,794,607 | 12/1988 | Devlin | 372/49 |
| 4,872,176 | 10/1989 | Hammer | 372/50 |
| 4,881,236 | 11/1989 | Brueck | 372/45 |
| 4,942,366 | 7/1990 | Toda | 330/4.3 |
| 4,976,539 | 12/1990 | Carlson et al. | 372/96 |

OTHER PUBLICATIONS

"Phase-locked Operation Of Coupled Pairs Of Grating-surface—emitting Diode Lasers" J. M. Hammer et al. *Appl. Phys. Lett.* 50 (11) Mar. 16, 1987 pp. 659-661.

"Two-Dimensional Coherent Laser Arrays Using Grating Surface Emission" G. Evans *IEEE Journal of Quantum Electronics* vol. 25, No. 6, Jun. 1989, pp. 1525-1538.

"Quantum Well Lasers-Gain, Spectra, Dynamics", Y. Arakawa *IEEE Journal of Quantum Electronics*, vol. QE-22, No. 9, Sep. 1986, pp. 1887-1986.

"Analysis of Grating-coupled Radiation In GaAlAs Lasers And Waveguides-II: Blazing Effects", W. Streifer, et al., *IEEE Journal of Quantum Electronics*, vol. QE-12, Aug. 1976 vol. 25, No. 6, Jun. 1989, pp. 1525-1538.

"Demonstration of a Monolithic, Grating-Surface-Emitting Laser Master Oscillator-Cascaded Power Amplifier Array", N. W. Carlson *IEEE Photonics Technology Letters*, vol. 2, No. 10, Oct. 1990 pp. 708-710.

"Coherent Operation of Monolithically Integrated Master Oscillator Amplifiers" D. F. Welch, et al. *Electronic Letters*, vol. No. 17, Aug. 16, 1990, pp. 1327-1329.

*Primary Examiner*—Georgia Y. Epps
*Attorney, Agent, or Firm*—William J. Burke

[57] ABSTRACT

A semiconductor light emitter comprising a substrate of a semiconductor material having a pair of opposed surfaces and a body of semiconductor material on one of the surfaces. The body includes a pair of clad layers of opposite conductivity types having an intermediate quantum well region therebetween. The clad layers are of a semiconductor material which forms a heterojunction with the material of the quantum well region. The clad layers and the quantum well region form a waveguide which extends along the body. A plurality of gain sections are formed in the body spaced along and optically coupled by the waveguide. Each of the gain sections is adapted to generate light therein when a voltage is placed thereacross. One of the gain section has gratings at each end thereof which are adapted to reflect light back into the one gain section and thereby create a beam of light. The grating between the one gain section and an adjacent gain section is adapted to allow some of the light generated in the one gain section to pass therethrough along the waveguide to the next gain section. Each of the other gain sections have gratings adjacent an end opposite the first gain sections. The periods of the grating are such that no self-oscillation of the light in the waveguide occurs so that each of the other gain sections serve as single pass amplifiers. The gratings also direct the amplified light from the other gain sections out of the body.

16 Claims, 2 Drawing Sheets

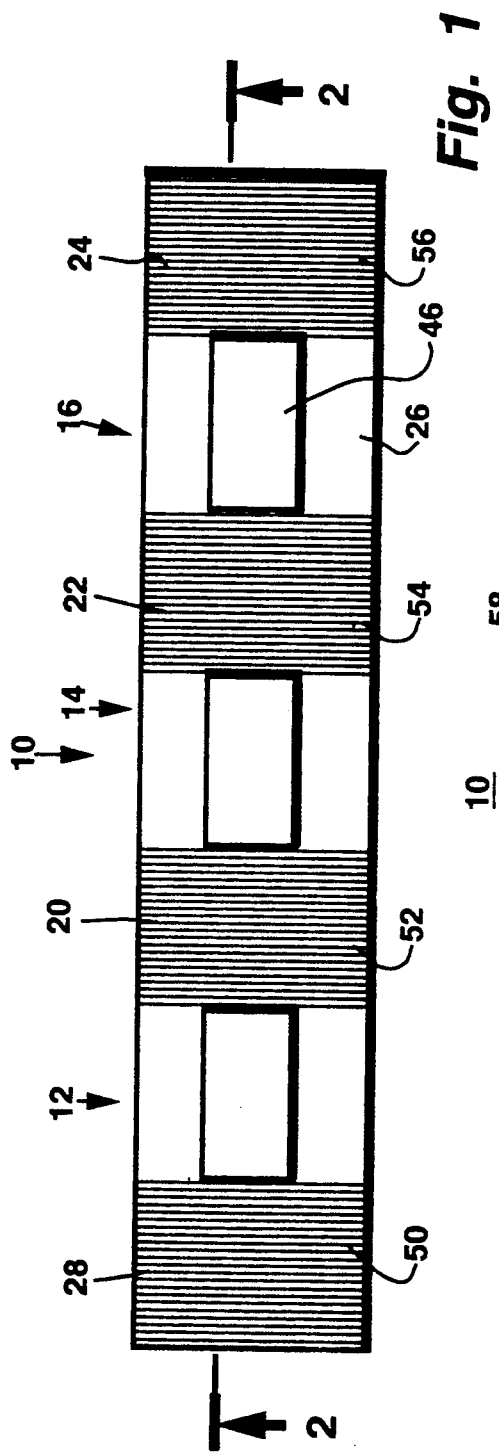
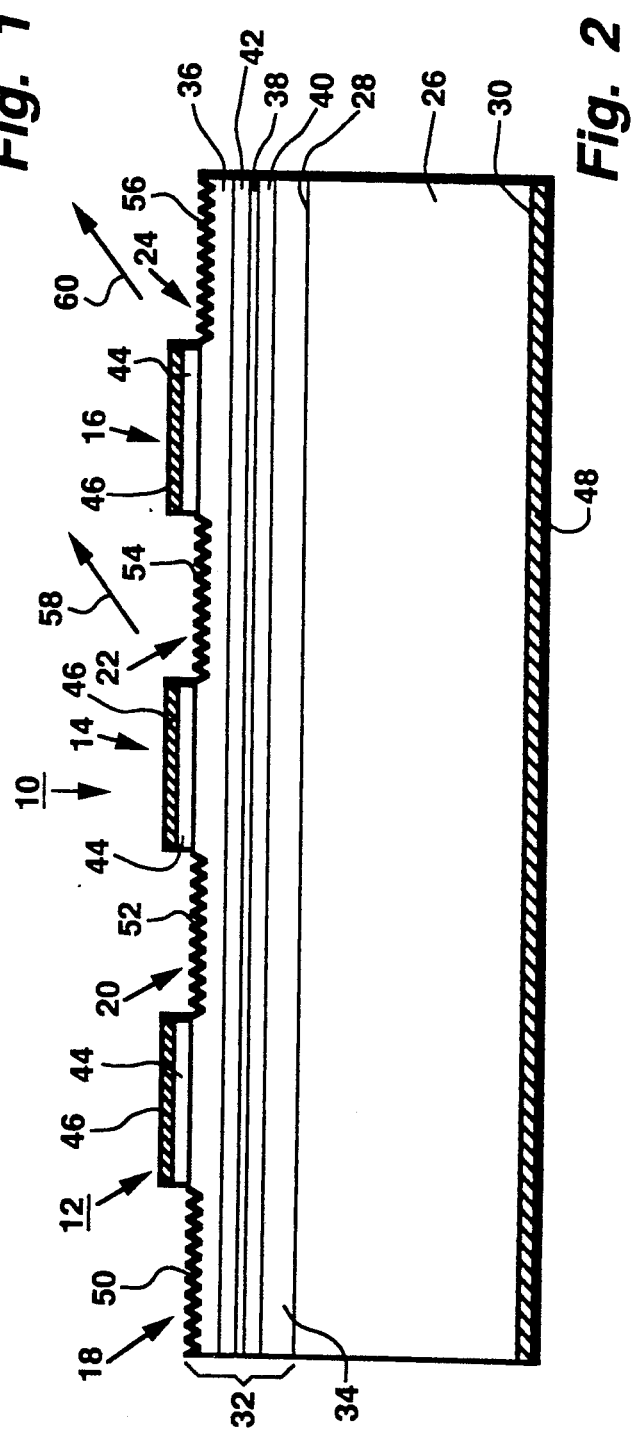

MONOLITHIC SEMICONDUCTOR LIGHT EMITTER AND AMPLIFIER

The invention described herein was made in the performance of work under NASA Contract No. NAS1-18525 and is subject to the provisions of Section 305 of the National Aeronautics and Space Act of 1958 (72 Stat. 435; 42 U.S.C. 2457).

FIELD OF THE INVENTION

The present invention relates to a monolithic semiconductor light emitter and amplifier, and, more particularly, to a monolithic surface emitting array including a master optical oscillator and one or more surface emitting optical amplifiers in series with the oscillator.

BACKGROUND OF THE INVENTION

Optical communication systems, in general, include means for generating a modulated beam of light, means for transmitting the beam of light over a relatively long distance, means for receiving the beam of light and means for converting the beam of light to a digital signal. One type of device used to generate the beam of light is a laser diode. However, in order to be able to transmit the beam of light over relatively long distances, it is desirable to emit a high powered beam of light. To achieve this high powered beam of light, it is desirable to be able to amplify the beam of light emitted by the laser diode. Also, in order to have a light emitter which is physically as small as possible, it is desirable to have the laser diode light emitter and the amplifier in a monolithic form.

SUMMARY OF THE INVENTION

The present invention relates to a semiconductor optical device which includes a plurality of spaced optical gain sections formed in a common substrate and optically coupled together in series. One of the gain sections is an optical oscillator which is capable of generating a beam of light and directing the beam toward at least one of the other gain sections. Each of the other gain sections is a single pass amplifier which receives the light and amplifies it as the light passes through the amplifier gain sections. At the output of each of the amplifier gain sections is a passive waveguide containing an output grating for directing at least a portion of the amplified beam out of the device.

More particularly, the present invention relates to a surface emitting semiconductor light emitter which comprises a body of a semiconductor material having a surface and a plurality of spaced gain sections in the body. Each of the gain sections is adapted to generate light therein when a voltage is placed thereacross. Means is provided in the body at the ends of a first gain section for at least partially reflecting the light generated therein back and forth along a path through said first gain section to generate a beam of light therein which is emitted from one end of the first gain section. The body includes means for transmitting the beam of light from one end of the first gain section to an end of an adjacent second gain section which is adapted to amplify the beam of light as it passes through the second gain section. An output grating is provided on the body at the other end of the second gain section. Said output grating being adapted to direct at least a portion of the light passing through the second gain section out of the body. The output grating having a period such that only the first grating order of the light is coupled out of the passive waveguide and the second grating order is not coupled into the fundamental mode of the path of the beam through the second gain section so that self-oscillation of the light in the path of the beam through the gain section does not occur so as to provide only a single pass gain.

BRIEF DESCRIPTION OF THE DRAWINGS

FIG. 1 is a top plan view of a monolithic semiconductor optical surface emitting device in accordance with the present invention;

FIG. 2 is a sectional view taken along line 2—2 of FIG. 1; and

DETAILED DESCRIPTION

Figure 3:
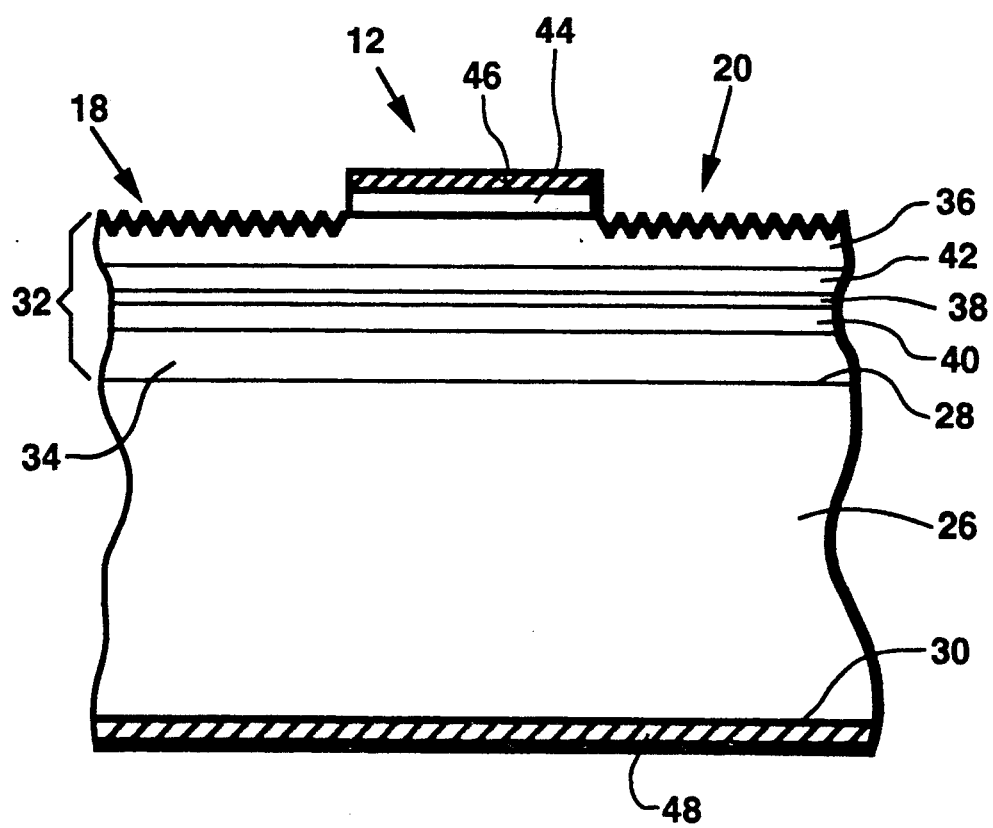
FIG. 3 is an enlarged sectional view of one of the gain sections of the device shown in FIGS. 1 and 2.

Referring to FIGS. 1 and 2, there is shown a monolithic semiconductor optical surface emitting device 10 of the present invention. The surface emitting device 10 includes a first gain section 12, which is an optical oscillator, and second and third gain sections 14 and 16, which are optical amplifiers, in optical series with the first gain section 12. At the ends of the first gain section 12 are distributed Bragg reflectors 18 and 20 which serve to at least partially reflect light generated in the first gain section 12 back and forth through the first gain section. The reflector 20 is between the first gain section 12 and the second gain section 14 and is designed to permit some of the light generated in the first gain section 12 to pass into the second gain section 14. Between the second and third gain sections 14 and 16 and at the end of the third gain section 16 away from the second gain section 14 are separate output gratings 22. Each of the output gratings 22 is designed to deflect at least some of the light passing through the gain sections 14 and 16 out of the device 10.

The surface emitting device 10 is formed of a body 24 of a semiconductor material which includes a substrate 26 having first and second opposed surfaces 28 and 30. On the first surface 28 of the substrate 26 is a waveguide 32. The waveguide 32 shown comprises a pair of clad layers 34 and 36 of a semiconductor material of opposite conductivity types. Thus, if the clad layer 34 is of N-type conductivity, the clad layer 36 is of P-type conductivity. Between the two clad layers 34 and 36 is a thin intermediate quantum well layer 38 of a semiconductor material which is undoped. The quantum well layer 38 can be either a single quantum well or a multiple quantum well. A description of quantum well layers can be found in the article of Y. Arakawa entitled "Quantum Well Lasers-Gain, Spectra, Dynamics", published in IEEE JOURNAL OF QUANTUM ELECTRONICS, Vol QE-22, No. 9, Sep. 1986, pgs. 1887-1986. The clad layers 34 and 36 are of a material having an energy band-gap higher than that of the material of the quantum well layer 38 so as to achieve both charge carrier and light confinement within the quantum well layer 38 and to form a heterojunction with the material of the quantum well layer. For example, the clad layer 34 and 36 may be of AlGaAs wherein the mole fraction of AlAs is about 70% ($Al_{0.7}Ga_{0.3}As$), and the quantum well layer 38 may be of GaAs.

Between the quantum well layer 38 and each of the clad layers 34 and 36 is a confinement layer 40 and 42 respectively, each of which is of the same conductivity type as its adjacent clad layer. The confinement layers 40 and 42 are typically composed of AlGaAs and may be graded so that the mole fraction of AlAs varies from that of the clad layers 34 and 36 to about one-half of that in the clad layers 26 and 28 at the quantum well layer 38. Thus, the composition of the graded confinement layers 40 and 42 would vary from $Al_{0.7}Ga_{0.3}As$ at the clad layers 34 and 36 to $Al_{0.3}Ga_{0.7}As$ at the quantum well layer 38. However, the confinement layers 40 and 42 may be of uniform composition having an energy band-gap between that of the materials of the clad layers 34 and 36 and the quantum well layer 38, such as $Al_{0.3}Ga_{0.7}As$.

As shown in FIG. 3, in the first gain section 12, a capping layer 44 is over the outermost clad layer 36. The capping layer 44 is of a semiconductor material of the same conductivity type as that of the clad layer 36, i.e., P-type conductivity. The capping layer 44 is preferably of GaAs. Each of the second and third gain sections 14 and 16 are of the same structure as the first gain section 12, shown in FIG. 3. Thus, each of the second and third gain sections 14 and 16 includes a capping layer 44 over the outermost clad layer 36.

The substrate 26 is of a conductivity type the same as that of the clad layer 34, i.e., N-type conductivity. The substrate 26 can be of any semiconductor material on which the waveguide 32 can be formed, such as GaAs. Typically, the clad layers 34 and 36 are of a thickness of about 1.2 micrometers (um), the quantum well layer 38 is of a thickness of about 50 to 100 Angstroms, the confinement layers 40 and 42 are of a thickness of about 0.2 to 0.4 micrometers, and the capping layer 44 is of a thickness of about 0.2 micrometers. A separate contact layer 46 of a conductive material is on and makes ohmic contact with the capping layer 44 of each of the gain sections 12, 14 and 16. A contact layer 48 of a conductive material is on and makes ohmic contact with the second surface 30 of the substrate 26. The contacts 46 and 48 allow a voltage to be applied across each of the gain sections 12, 14, and 16.

The reflectors 18 and 20 are provided in the surface of the outermost clad layer 36 at the ends of the first gain section 12 and over the waveguide 32. As shown in FIG. 3, each of the reflectors 18 and 20 is formed by a plurality of parallel V-shaped grooves 50 and 52 respectively extending transversely across the clad layer 36 perpendicular to the direction of light propagation indicated by the arrow 54. However, the reflectors 18 and 20 can be of any well known type. The reflectors 18 and 20 have a period such as to provide distributed Bragg reflectors of any order. This reflects light generated in the first gain section 12 back and forth across the first gain section 12 along the waveguide 32 providing the optical feedback necessary for laser oscillation. Thus, the first gain section 12 operates as an optical oscillator to generate a beam of substantially coherent light. The reflector 20 is designed to be at least partially transparent so that some of the light is emitted from the first gain section 12 along the waveguide 32 to the second gain section 14.

The output gratings 22 and 24 are each also formed by a plurality of parallel V-shaped grooves 54 and 56 respectively, extending transversely across the clad layer 36 perpendicular to the direction of light propagation. The output gratings 22 and 24 can also be of any well known type. The grating period of the output gratings 22 and 24 is selected so that light passing through the respective gain sections 14 and 16 is deflected out of the waveguide 32 and from the surface of the clad layer 36 at an angle as indicated by the arrow 58. However, the grating 22 between the second and third gain sections 14 and 16 has a grating period that only a portion of the light passing into it from the second gain section 14 is deflected out of the waveguide 32 and the remaining portion of the light passes along the waveguide 32 into the third gain section 16.

In order to prevent self-oscillation in the second and third gain sections 14 and 16, it is necessary that (1) the grating period of the output gratings 22 and 24 be such that the Bragg condition is not satisfied for any wavelength with the gain sections 14 and 16, and/or (2) that the second or any higher grating order not be coupled to the fundamental mode of the waveguide 32.

The range of grating periods which will satisfy the above condition is rather large. The following is an example for determining a suitable grating period. The second order diffraction order angle $\theta_2$ and the first diffracted grating order angle $\theta_1$ can be determined by the following formulae where both angles are measured with respect to the grating normal:

$$\theta_1 = \sin^{-1}[(\lambda/\Lambda) - n_e]$$

$$\theta_2 = \sin^{-1}[(2\lambda/\Lambda n_3) - 1]$$

where both angles are measured with respect to the grating normal, $n_e$ is the effective refractive index of the waveguide, $\Lambda$ is the grating period, and $\lambda$ is the wavelength of light in free space. For waveguides formed of GaAs/AlGaAs, the wavelength of light is 8500 Angstroms and the effective index $n_e$ of the waveguide is 3.4. Assuming that the amplifiers (the second and third gain sections 14 and 16) is to be designed so that the 8500 Angstrom light is outcoupled from the gratings at an angle $\theta_1$ of 45°, then from the above equations the grating period $\Lambda$ would be 3100 Angstroms and the second diffracted grating order angle $\theta_2$ would be 42°. For a grating period of 3100 Angstroms, the Bragg condition is satisfied only for wavelengths in the neighborhood of 1.5 micrometers, which is well outside the gain bandwidth of GaAs/AlGaAs devices. Also, since the second diffraction order angle $\theta_2$ is greater than 16° but less than 75°, the second diffraction order of the grating is not coupled into the fundamental mode of the waveguide or into the air, but is all coupled into substrate modes. Although this is a loss, it can be minimized by blazing the grating coupler so that most of the light is coupled into the first order. Blazing can be achieved as described in the article of W. Streifer et al., entitled "Analysis of Grating-coupled Radiation In GaAs:-GaAlAs Lasers And Waveguides-II: Blazing Effects", published in IEEE JOURNAL OF QUANTUM ELECTRONICS, Vol. QE-12, Aug., 1976, pages 494–499. Also, $\Lambda$ could be selected such that there is no angle that satisfies the second order condition. For example, if $\Lambda = 2300$ Angstroms, there is no real $\theta_2$, and the Bragg condition occurs at $\lambda = 7800$ Angstroms, which is outside the gain profile.

In the operation of the semiconductor light emitter 10, the first gain section 12 functions as an optical oscillator or laser. Thus, when a voltage above a suitable threshold is placed across the first gain section 12, light is generated in the first gain section and formed into a beam of substantially coherent light. Some of the generated light beam passes through the reflector 20, which is partially transmissive, along the waveguide 32 into the second gain section 14. The second gain section 14 functions as an optical amplifier. A voltage is applied across the second gain section 14 which is above the transparency level of the gain section 14 to cause light to be generated in the second gain section 14. The light passing through the second gain section 14 from the first gain section 12 results in the generation of additional light by stimulated emission resulting in the amplification of the light passing through the second gain section 14. The amplified light from the second gain section 14 passes into the grating 22. The grating 22 causes some of the light to be directed out of the waveguide 32 through the surface of the clad layer 36 as indicated by the arrow 58 in FIG. 2. However, some of the light passes through the grating 24 along the waveguide 32 into the third gain section 16. The third gain section 16 also functions as an optical amplifier in the same manner as the second gain section 14. Thus, a voltage of a value above the threshold of the third gain section 16 applied thereacross results in the amplification of the light passing therethrough. The amplified light passing from the third gain section 16 enters the grating 24 where it is deflected out of the waveguide 32 through the surface of the clad layer 36 as indicated by the arrow 60. As stated above, each of the second and third gain sections 14 and 16 are single pass optical amplifiers so that all of the light passes only once through each of the amplifiers. To optimize the single pass gain of the amplifiers 14 and 16, it is preferred to use a multi-quantum well active structure in the waveguide 32 rather than a single quantum well structure. Also, in order to overcome the relatively low coupling efficiencies of the output gratings 22 and 24, it is preferable to use a plurality of gain sections which are cascaded together through grating sections.

The semiconductor light emitter 10 can be made by epitaxially depositing on the surface 28 of the substrate 26 in succession the clad layer 34, confinement layer 40, quantum well layer or layers 38, confinement layer 42, clad layer 36 and capping layer 44. This can be done by any well known technique for epitaxially depositing the material of the layers, such as liquid phase or vapor phase epitaxy, metallo-organic chemical vapor deposition or molecular beam epitaxy. A masking layer, such as of a photoresist, is formed over the portion of the capping layer 44 where the gain sections 12, 14 and 16 are to be formed, and the remaining portion of the capping layer 44 is removed with a suitable etchant. The grooves 50, 52, 54 and 56 of the gratings 18, 20, 22 and 24 respectively are then etched into the exposed surface of the clad layer 36. The metal contacts 46 and 48 are then applied to the capping layer 44 and the substrate surface 30 by techniques such as evaporation in a vacuum or by sputtering.

Thus, there is provided by the present invention a surface emitting semiconductor light emitter which includes in a monolithic form an optical oscillator for generating a beam of light and at least one single pass optical amplifier which amplifies the light. This provides a light emitter which emits a high power beam of light but is relative small in size. Also, since all of the gain sections are of the same structure, even through one functions as an oscillator and the other as amplifiers, the device is easy to make. Although the light emitter is shown as having two amplifiers, it can have a single amplifier or more than two amplifiers cascaded together to achieve a greater magnification of the light. Also, other structures of the waveguide can be used. However, a structure having a quantum well active region is preferred.

What is claimed is:

1. In a surface emitting semiconductor light emitter comprising:
   a body of a semiconductor material having a surface;
   a plurality of gain sections in said body along said surface, each of said gain sections being capable of generating light therein when a voltage is placed thereacross;
   means in said body at each end of one of said gain sections for at least partially reflecting the light generated in said one gain section back and forth along a path therethrough to generate a beam of light that is emitted from one end of the one gain section toward a second gain section;
   means for transmitting the beam of light from the one gain section into one end of a second gain section which is capable of amplifying the beam of light; and
   a grating at the other end of the second gain section for receiving the amplified beam of light and directing at least a portion of the beam out of the body through the surface thereof;
   said grating having a period such that only the first grating order of the light is coupled out of the second gain section and the second grating order is not coupled into the fundamental mode of the path of the beam through the second gain section so that self-oscillation of the light through the second gain section does not occur so as to provide only a single pass gain.

2. A light emitter in accordance with claim 1 wherein the body has a waveguide therein extending through the gain sections for guiding the beam of light through the body.

3. A light emitter in accordance with claim 2 wherein the second gain section includes means for generating light in the waveguide when a voltage is applied across the second gain section to amplify the beam of light 4. A light emitter in accordance with claim 3 in which the waveguide includes an intermediate layer of a semiconductor material having a separate clad layer of a semiconductor material on each side of the intermediate layer, the clad layers are of a material which forms a heterojunction with the material of the intermediate layer and one of the clad layers is of a conductivity type opposite to that of the other clad layer.

5. A light emitter in accordance with claim 4 in which the intermediate layer is a quantum well region.

6. A light emitter in accordance with claim 4 in which the intermediate layer is a multi-quantum well region.

7. A light emitter in accordance with claim 4 wherein each of the gain sections includes a pair of contacts on the body at opposite sides of the intermediate layer to allow a voltage to be applied across the gain section.

8. A light emitter in accordance with claim 7 in which the means at the ends of the first gain section for reflecting the light back and forth in the first gain section includes a grating in the body at each end of the first gain section, one of said gratings being between the first and second gain sections and being partially transparent to the light generated in the first gain section to allow some of said light to pass along the waveguide to the second gain section.

9. A light emitter in accordance with claim 8 including at least three gain sections along said waveguide with the second and third gain sections being capable of amplifying the beam of light passing along the waveguide, a grating between the second and third gain sections and a grating at the end of the third gain section opposite the second gain section, both of the gratings being capable of directing at least some of the amplified beam out of the body through said surface and the grating between the second and third gain sections being capable of allowing some of the light beam from the second gain section to pass into the third gain sections, each of the gratings having a period such that only the first grating order of the light is coupled out of the device and the second grating order is not coupled into the fundamental mode of the waveguide so that self-oscillation of the light in the waveguide through the second and third gain sections does not occur so as to provide only a singly pass gain.

10. In a surface emitting semiconductor light emitter comprising:
- a substrate of a semiconductor material having a pair of opposed surfaces;
- a body of a semiconductor material on one of said surfaces of said substrate;
- an optical waveguide extending through said body for guiding a beam of light through said body;
- first and second gain sections in said body and spaced along said waveguide, each of said gain sections being capable of generating light in said waveguide when a voltage is applied across the gain section;
- means in said body at each end of the first gain section for at least partially reflecting the light generated in said first gain section back and forth along said waveguide in said first gain section to generate a beam of light therein which is emitted from one end of the first gain section along said waveguide to one end of said second gain section;
- said second gain section adapted to amplify the beam of light passing therethrough along said waveguide; and
- a grating in said body at the other end of the second gain section for receiving the amplified beam of light from the second gain section and directing at least a portion the amplified beam of light out of the body;
- said grating having a period such that only the first grating order of the light is coupled out of the amplifier and the second grating order is not coupled into the fundamental mode of the waveguide so that self-oscillation of the light in the waveguide does not occur so as to provide only a single pass gain in the second gain section.

11. A light emitter in accordance with claim 10 in which the waveguide includes an intermediate layer of semiconductor material having a separate clad layer of a semiconductor material on each side of the intermediate layer, the clad layers are of a material which forms a heterojunction with the material of the intermediate layer and one of the clad layers is of a conductivity type opposite that of the other clad layer.

12. A light emitter in accordance with claim 11 in which the intermediate layer is a quantum well region.

13. A light emitter in accordance with claim 11 in which the intermediate layer is a multi-quantum well region.

14. A light emitter in accordance with claim 11 wherein each gain section includes a pair of contacts at opposite sides of the intermediate layer to allow a voltage to be applied across the gain section.

15. A light emitter in accordance with claim 14 in which the means at each end of the first gain section for reflecting the light back and forth comprises a separate grating extending across the body at each end of the first gain section, said gratings being adapted to reflect the light generated in the first gain section back into the first gain section with the grating at the end of the first gain section adjacent the second gain section adapted to allow some of the generated light to pass therethrough along the waveguide to the second gain section.

16. A light emitter in accordance with claim 15 including a third gain section in said body and along said waveguide spaced from and adjacent the end of the second gain section away from the first gain section, said third gain section adapted to generate light therein when a voltage is placed thereacross so that the third gain section is capable of amplifying the light beam, the grating at the other end of the second gain section being between the second and third gain section and adapted to allow some of the amplified light from the second gain section to pass into one end of the third gain section, and a grating across the body at the other end of the third gain section adapted to direct amplified light passing from the third gain section out of the body, said grating having a period such that only the first grating order of the light is coupled out of the gain section and the second grating order is not coupled into the fundamental mode of the waveguide so that self-oscillation of the light in the waveguide does not occur so as to provide only a single pass gain in the third gain section.

* * * * *